United States Patent
Tenbroek

(10) Patent No.: US 7,595,695 B2
(45) Date of Patent: Sep. 29, 2009

(54) COMPENSATED OPERATIONAL AMPLIFIER AND ACTIVE RC FILTER INCLUDING SUCH AN AMPLIFIER

(75) Inventor: Bernard Mark Tenbroek, West Malling (GB)

(73) Assignee: Mediatek Inc., Hsin-Chu (TW)

( * ) Notice: Subject to any disclaimer, the term of this patent is extended or adjusted under 35 U.S.C. 154(b) by 75 days.

(21) Appl. No.: 11/804,636

(22) Filed: May 18, 2007

(65) Prior Publication Data
US 2008/0284490 A1    Nov. 20, 2008

(51) Int. Cl.
*H03F 1/14*    (2006.01)
(52) U.S. Cl. .................................. 330/292
(58) Field of Classification Search ......... 330/292–293, 330/297; 327/552
See application file for complete search history.

(56) References Cited
U.S. PATENT DOCUMENTS

| | | | |
|---|---|---|---|
| 4,593,250 A | 6/1986 | Lucas et al. | |
| 6,507,246 B1 | 1/2003 | Brokaw | |
| 6,573,790 B2 * | 6/2003 | Steensgaard-Madsen | .... 330/107 |
| 6,642,791 B1 | 11/2003 | Balan | |
| 2002/0003441 A1 | 1/2002 | Steensgaard-Madsen | |
| 2002/0190793 A1 * | 12/2002 | Moon | .......................... 330/253 |
| 2004/0104775 A1 * | 6/2004 | Seremeta | ..................... 330/310 |
| 2006/0091955 A1 * | 5/2006 | Choi | .......................... 330/260 |

OTHER PUBLICATIONS

D.S. McPherson et al. "A 3-V Fully Differential Distributed Limiting Driver for 40-Gb/s Optical Transmission Systems" IEEE Journal of Solid-State Circuits, vol. 38, No. 9 (2003).

* cited by examiner

*Primary Examiner*—Robert Pascal
*Assistant Examiner*—Khiem D Nguyen
(74) *Attorney, Agent, or Firm*—Winston Hsu

(57) ABSTRACT

A method of compensating a monolithic integrated operational amplifier against process and temperature variations, such that the operational amplifier is suitable for use in an active filter, the method comprising a providing an amplifier having a first stage and an output stage, wherein the output stage drives an RC load, and wherein a compensation capacitor at an output of the first stage is selected so as to scale with the capacitance C of the RC load, and a transconductance of the first stage is a function of the resistance R of the RC load.

8 Claims, 4 Drawing Sheets

COMPENSATED OPERATIONAL AMPLIFIER AND ACTIVE RC FILTER INCLUDING SUCH AN AMPLIFIER

FIELD OF THE INVENTION

The present invention relates to an operational amplifier and to an active RC filter including such an amplifier.

BACKGROUND OF THE INVENTION

A popular method to implement low frequency filters on integrated circuits is to use operational amplifiers with feedback networks constructed from resistors and capacitors. Filters of this type are generally known as active RC filters. In an ideal world the filter response would be defined purely by the resistor and capacitor values, and the gain of the operational amplifier will always be sufficiently high, irrespective of filter operating frequency, to have a negligible effect on the filter response.

Whilst it is relatively easy to make operational amplifiers having a sufficiently high gain and bandwidth for the operational amplifier to have negligible effect on the filter response, this is generally at the expense of power consumption. Power consumption gives rise to excess heat generation, and in the context of battery powered portable devices, such as mobile telephone handsets, excess current consumption which reduces the time interval between having to recharge the battery. Allowing the unity gain bandwidth to drop causes increased ripples and peaks in the filter response compared to the ideal response.

SUMMARY OF THE INVENTION

According to a first aspect of the present invention there is provided an integrated amplifier comprising a first gain stage having a compensation capacitor, the first gain stage driving an output stage which, in use, drives an RC load, and wherein a gain of the first transconductance stage varies inversely with the resistive value R of the RC load, and the compensation capacitor is proportional to the capacitive value C of the RC load.

It is thus possible to provide an operational amplifier wherein the unity gain bandwidth of the amplifier can be reduced without causing significant deviation from a desired filter response. The inventor has realised that filter performance can be improved by controlling the unity gain bandwidth (the frequency at which the open loop gain of the amplifier falls to unity) to be substantially constant, or at least to track other component variations. This, in turn, significantly reduces the current consumed by the operational amplifier.

Operational amplifiers are often characterised in terms of the frequency at which their gain falls to unity, known as the "unity gain bandwidth". The unity gain bandwidth of an amplifier typically depends on the characteristics of the transistors and other components used to construct the amplifier, and as such the unity gain bandwidth varies with temperature and process variations. It is known that RC component values of an active RC filter can be modified to compensate for the effect of the finite value of the amplifier's unity gain bandwidth on the filter response. However such compensation techniques presuppose that unity gain bandwidth and the RC component values are constant or at least track each other. This is generally not the case within monolithic integrated circuits where process variations during fabrication can often result in component values varying by 10 to 30% from one batch of components to another. Furthermore component values within an integrated circuit are affected by temperature and the temperature dependency of the RC component values and of the amplifier unity gain bandwidth are typically completely different. This makes it difficult to define the RC filter component values with sufficient accuracy to compensate for the reduced unity gain bandwidth of the operational amplifier.

The present invention avoids these problems because the inventor has realised that the matching of similar types of components within the integrated circuit makes it possible to reduce the unity gain bandwidth of the amplifier because variations in the compensation capacitor can be made to track variations in the load capacitor and variations in the transconductance of the first gain stage can be made to compensate for changes in the resistance of the load, such that the unity gain bandwidth of the amplifier tracks the bandwidth of the filter as defined by the RC components.

BRIEF DESCRIPTION OF THE DRAWINGS

The present invention will further be described, by way of example, with reference to the accompanying Figures, in which.

DESCRIPTION OF PREFERRED EMBODIMENTS OF THE PRESENT INVENTION

Figure 1:
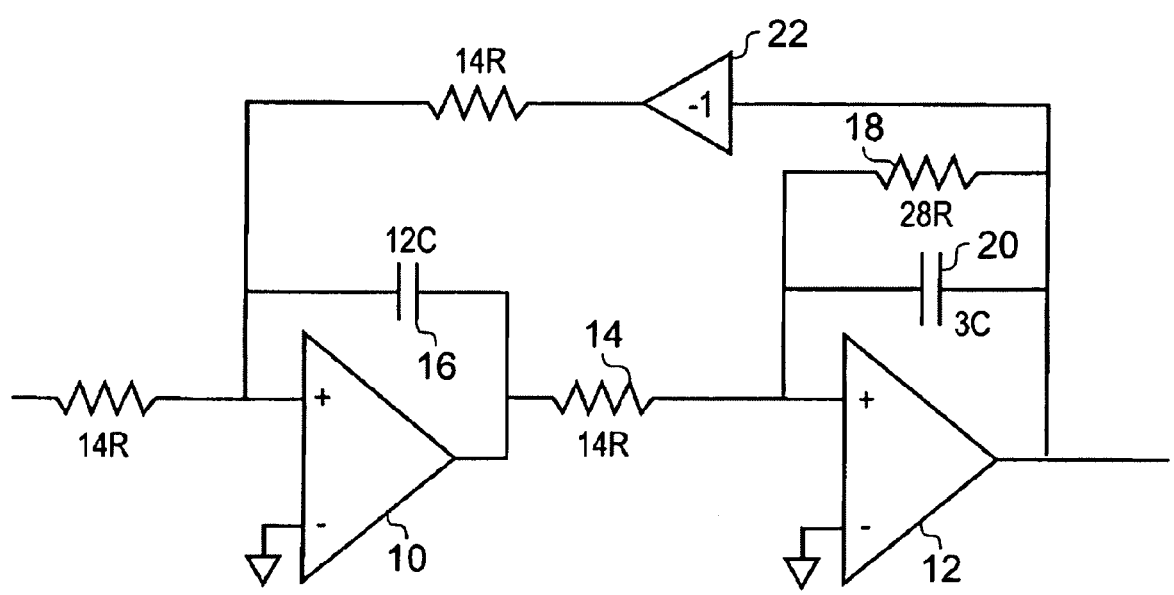
FIG. 1 schematically illustrates a typical bi-quad filter.

FIG. 1 schematically shows an implementation of a bi-quad filter which would typically be found within an integrated circuit. The precise design of the filter is not relevant to the present invention. However, it is worth noting that the filter components are selected to be ratios of a unit capacitor size and unit resistor size such that the filter response, which is a function of the unit resistance and unit capacitance used to implement the filter, is held constant even with process variations and temperature changes. Exemplary values are placed against the filter components for guidance only.

It can be seen that the first and second operational amplifiers 10 and 12 have their inverting inputs connected to ground and consequently the action of the operational amplifier is such that the non-inverting inputs represent a virtual earth. It can therefore be seen that, looking from the output of the first operational amplifier 10, it is effectively connected to earth via a first resistor 14 which is effectively in parallel with a capacitor 16 (because each of these components connects to a virtual earth, although not the same node). Similarly, looking from the output of the second operational amplifier 12, it can be seen that its output comprises a parallel resistor and capacitor combination 18 and 20, respectively, also connecting to a virtual earth, which in this instance is the non-inverting input of the amplifier 12. From this it follows that, from the operational amplifiers point of view, its output is a parallel RC combination connected to earth. This representation will be used hereinafter. It should be noted that in this bi-quad circuit, an inverting amplifier 22 is shown. When the operational amplifiers 10 and 12 are implemented as differential output operational amplifiers, then the inverter 22 can be omitted by virtue of cross coupling the outputs from the operational amplifier 12, as is well known to the person skilled in the art.

Figure 2:
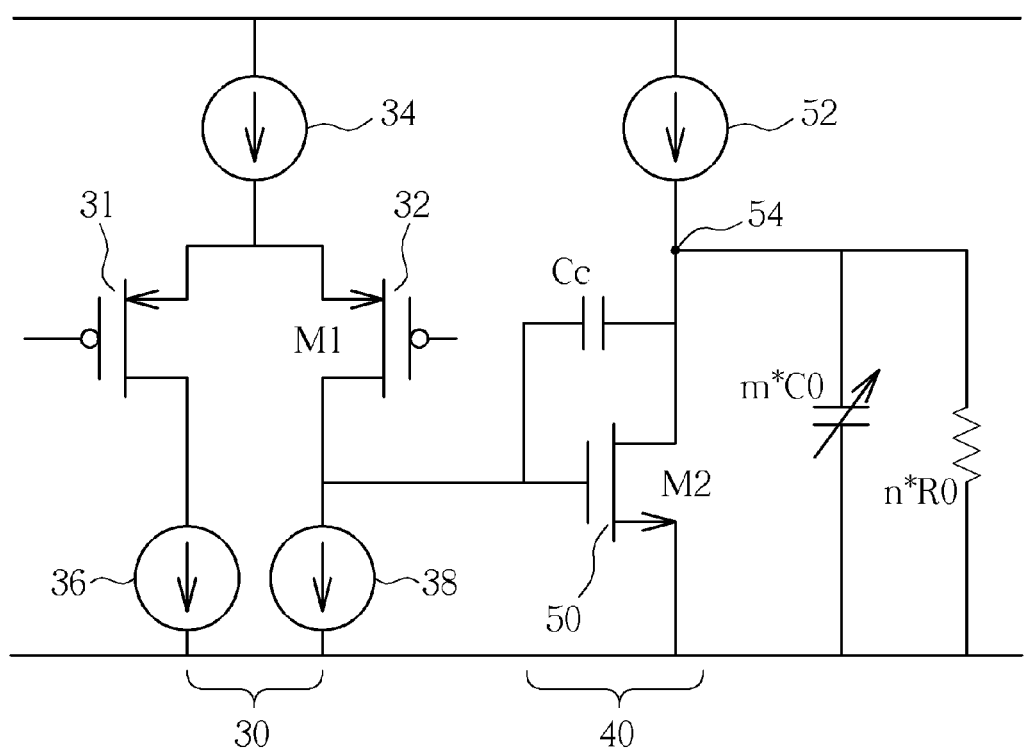
FIG. 2 schematically illustrates an operational amplifier, together with its load, constituting an embodiment of the present invention.

FIG. 2 schematically illustrates a well known two stage operational amplifier topology. The operational amplifier comprises an input stage, generally designated 30 comprising first and second P-type transistors 31 and 32 connected in a long tail pair configuration. The transistors receive a bias current from a controllable current source 34.

The drains of each of the transistors 31 and 32 are connected to ground via a load, which could be a resistor, but more preferably is an active load 36 and 38 for each transistor 31, and 32, respectively.

Typically for a differential implementation each transistor 31 and 32 has its own output stage 40 connected to the node between its drain and its respective active load. For simplicity, only the output stage associated with the transistor 32 is shown, although it should be realised that similar components exist in association with the transistor 31. The output stage 40 comprises a further N-type transistor 50 receiving current from a current source 52. The transistor 50 is connected such that its drain receives the current from the current source 52 (active load) and is also connected to an output node 54 of the amplifier which has a load comprising a resistor and a capacitor in parallel. In order to provide stability a compensation capacitor $C_C$ is connected to the output of the first amplifier stage 30. The compensation capacitor could be connected directly to ground, but usually the advantage of the Miller effect is taken so as to reduce the physical size of the capacitor and hence the capacitor extends between the gate of the transistor 50 and its drain.

The inventor has noted that the operational amplifier unity gain bandwidth can be reduced below the traditional design target to a point where the effect of the finite operational amplifier unity bandwidth on the filter response is significant, but where steps have been undertaken to make the operational amplifier unity gain bandwidth substantially invariant with process and temperature such that the effect of this reduced unity gain bandwidth figure on the filter frequency response can be compensated for by adjusting the filter resistor and/or filter capacitor values. This allows the current drawn by the amplifier to be significantly reduced, which can be useful in extending the operational time of battery powered devices.

It is known that the unity gain bandwidth $\omega_0$ of the operational amplifier is proportional to the transconductance of the first stage $g_{m1}$ divided by the value of the compensation capacitor $C_C$.

We also know that we wish to tune the filter characteristic such that, after tuning, the RC product of the load is constant. It will be recalled that the resistor and capacitor values are selected to be multiples of a unit value, such that if the unit values are $C_0$ and $R_0$, respectively, then the capacitive load at the output can be represented as $mC_0$ and the resistive value at the output can be represented as $nR_0$. As a result we can write two equations $$\omega_0 = a_1 \frac{g_{m1}}{C_C} \qquad \text{Equation 1}$$

$$m \cdot C_0 \cdot n \cdot R_0 = \frac{m \cdot n}{\omega_1} \qquad \text{Equation 2}$$

where $\omega_0$ is the unity gain bandwidth, $g_{m1}$ is the transconductance of the first amplification stage, $C_C$ is the value of the compensation capacitor, $a_1$ is a constant, $\omega_1$ is the characteristic bandwidth of the RC filter, $C_0$ is the value of the unit capacitor, and $R_0$ is the value of the unit resistor, and m and n are co-efficients.

From inspection we can see that the unity gain bandwidth may be maintained proportional to the characteristic tuned bandwidth (which depends on the RC component values, and hence varies with process variations—although typically some means of filter tuning is provided by adjusting the unit R, unit C or both), and consequently constant, if we set $g_{m1}$ to be inversely proportional to the unit resistor and the compensation capacitor $C_C$ to be proportional to the unit capacitor.

Having the compensation capacitor scale proportionately with the unit capacitor is relatively easy to achieve because process variations will effect each of these capacitors equally. Thus if we let $$g_{m1} = \frac{a_2}{R_0} \qquad \text{Equation 3}$$

$$C_C = a_3 \cdot C_0 \qquad \text{Equation 4}$$

we can then substitute in to Equation 1 and replace $R_0$ and $C_0$ using Equation 2 to yield $$\omega_0 = a_1 \cdot \frac{a_2}{R_0} \cdot \frac{1}{a_3 C_0} = \frac{a_1 \cdot a_2 \cdot \omega_1}{a_3} \qquad \text{Equation 5}$$

Constant $a_1$ is a function of the operational amplifier design. To a first order approximation this is proportional to the voltage gain of the second stage 40. However, we have control over the constants $a_2$ and $a_3$. Taking matching and sensitivity to process and temperature variations into consideration it is preferable that $a_2$ and $a_3$ are integer values.

Figure 3:
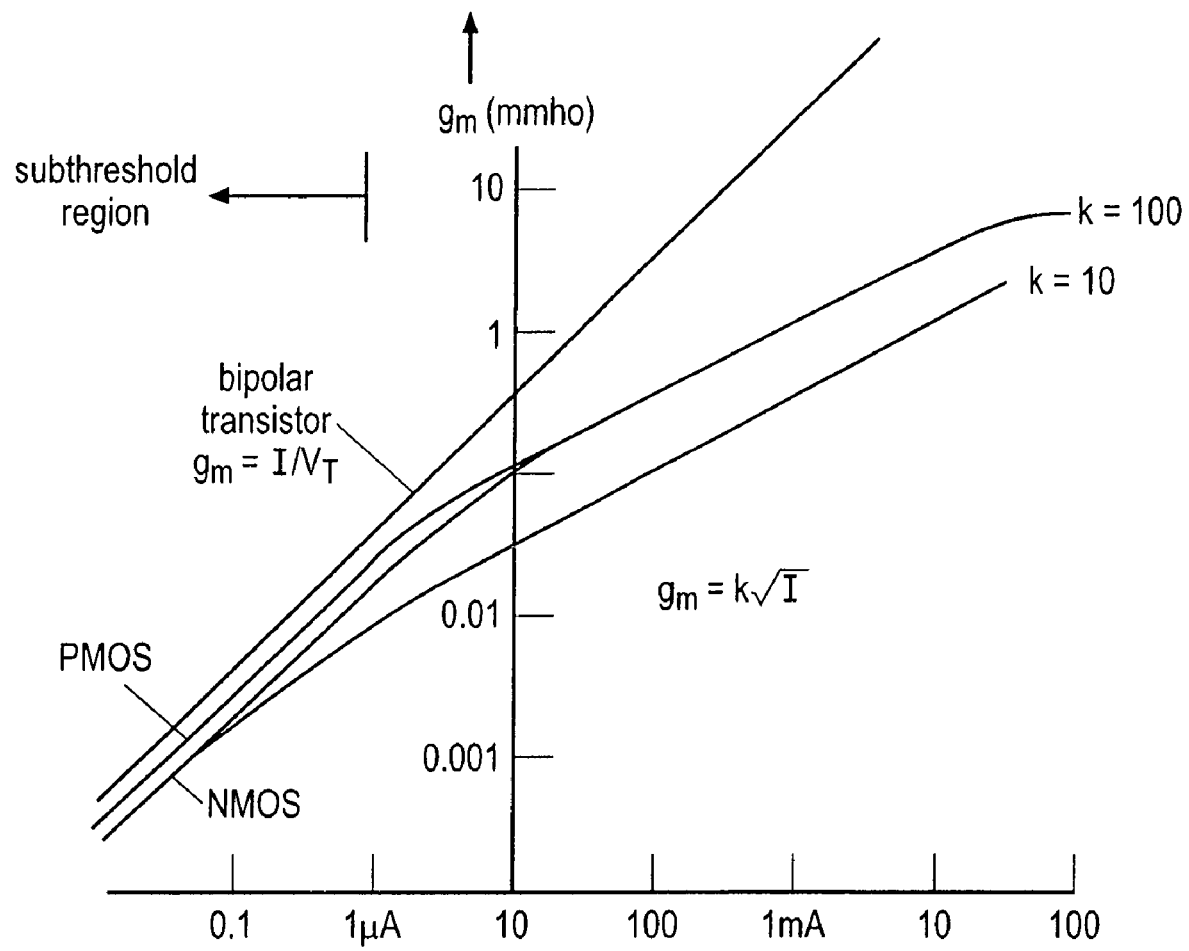
FIG. 3 is a graph showing variation in $g_m$ as a function of drain current.

In order to vary the transconductance of the first stage, it is necessary to vary the bias current provided to that stage. FIG. 3 is a representative graph of transconductance versus drain current for a transistor. It can be seen that the transconductance rises non-linearly with the drain current. Consequently, it follows that if the value of $R_0$ increases due to process or temperature variations, then the value of the transconductance should be reduced by reducing the bias current to the input stage 30. In fact, a very simple approximation set out in "The Art of Electronics", Horowitz and Hill 2nd Edition, page 132, is that $g_m$ varies as the square root of the drain current.

Figure 4:
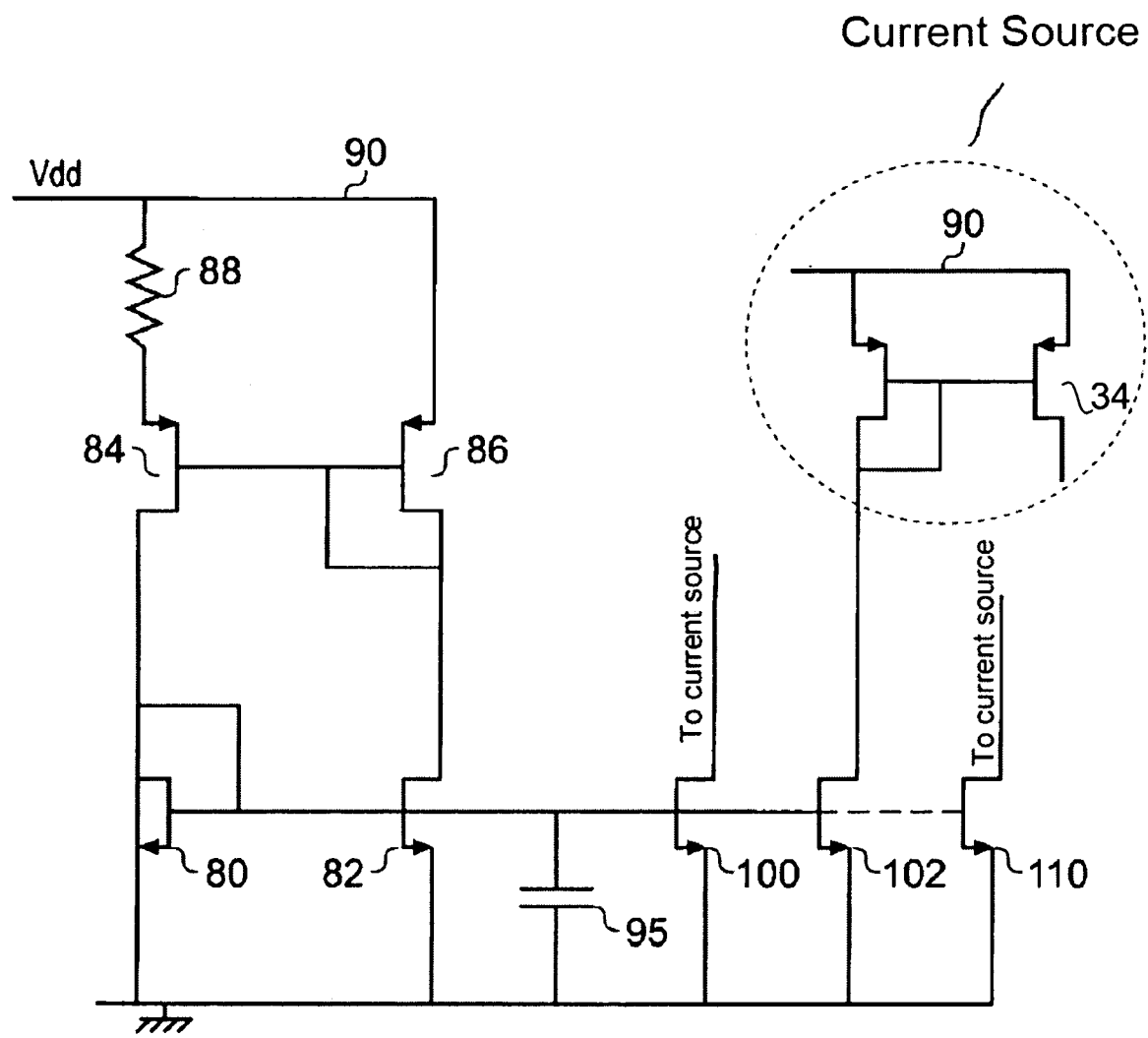
FIG. 4 illustrates a bias circuit for the operational amplifier of FIG. 2.

The purpose of the circuit shown in FIG. 4 is to generate a current that can be caused to flow as the current source 34 of FIG. 2, such that the current is proportional to $$\frac{1}{R_0}.$$

The circuit comprises two current mirrors. Transistors 80 and 82 form a first current mirror which ensures that the same current flows through both branches of the circuit, as defined by transistors 80 and 84 in one branch and transistors 82 and 86 in the other branch.

The transistors 84 and 86 also form a current mirror, but transistor 84 is heavily degenerated by resistor 88 extending between its source and the positive power rail 90. Hence the $g_m$ of transistor 84 is roughly inversely proportional to resistor 88.

This current is forced to flow in transistor 86 by the current mirror action, and also in transistor 82 by virtue of it being in series connection with transistor 86. The gate voltage at transistor 82 is provided to current distribution transistors 100, 102 and 110.

Scaling between the sizes of the transistors in the current mirrors can be employed to vary the characteristics of the circuit. Thus, if transistor 84 is made larger than transistor 86 by a factor K, then for square law FETs (such as long channel devices) the current generated through transistor 86, and hence reproduced in transistor 100, 102 and 110 is given by $$I = \frac{2}{R88} * \left(1 - \frac{1}{\sqrt{K}}\right)$$

where R88 is the resistance of the resistor 88 in FIG. 4.

For stability a capacitor 95 extends between the gates of transistors 82, 100, 102, 110 and the load ground.

The current from the current distribution transistors 100, 102, 110 can be supplied to well known current mirror arrangements to, for example, act as the current source 34 of FIG. 2.

The amplifier of FIG. 2 is suited for use in the provision of active filters. Filter designers for integrated active filters have had to come to terms with the fact that process variations and temperature changes within an integrated circuit can give rise to changes in the value of the resistors and capacitors that they use. They compensate for this, as shown in FIG. 1, by selecting the values of the capacitors and resistors to be multiples of the unit capacitor and unit resistor such that temperature or process effects in one part of the filter are cancelled out by the corresponding and well matched temperature and process effects in another part of the filter. By extending this concept to include the effect of an operational amplifier with a low unity gain bandwidth figure, but whose characteristic can also track accurately with the same capacitive and resistance changes that occur as a result of manufacturing process variations and temperature fluctuations, then the designer of the filter is able to produce an active filter whose characteristic is reliable but which has a significantly reduced current requirement by virtue of the reduced unity gain bandwidth figure.

The invention clamed is:

1. An integrated amplifier comprising a first gain stage having a compensation capacitor, the first gain stage driving an output stage, which, in use, drives an integrated RC load, and wherein a transconductance of the first gain stage varies inversely with a resistive value R of the RC load, a value of a coefficient of proportionality of the compensation capacitor with respect to a capacitor C of the RC load is predetermined, and the value of the capacitor C is adjusted to set an RC product to a desired value.

2. An integrated amplifier as claimed in claim 1, further comprising a circuit for controlling the transconductance of the first gain stage.

3. An integrated amplifier as claimed in claim 2, in which the first gain stage comprises a pair of transistors in a long tail pair configuration and a current source for supplying a bias current to the transistors in the long tail pair, and wherein the bias current is controlled so as to vary the transconductance of the first gain stage.

4. An integrated amplifier as claimed in claim 3, in which a resistor whose value is matched to the value of the resistor R of the RC load is used to control the current to the first gain stage.

5. An integrated amplifier as claimed in claim 3, in which a resistor is used to define the current flowing in a current bias circuit which is used to set the current flowing in the first gain stage.

6. An active filter comprising an amplifier as claimed in claim 1, in conjunction with resistive and capacitive elements for defining the filter characteristics.

7. A method of compensating a monolithic integrated operational amplifier against process and temperature variations, such that the operational amplifier is suitable for use in an active filter, the method comprising providing an operational amplifier having a first stage and an output stage, wherein the output stage drives an integrated RC load, and wherein a transconductance of the first stage is a function of a resistance R of the RC load, a product of R and C of the RC load is adjustable so as to set the RC product to a desired value, and wherein a compensation capacitor at an output of the first stage has a predetermined relationship with a value of the capacitance C of the RC load.

8. An integrated amplifier comprising:
a first gain stage having a single compensation capacitor, the first gain stage driving an output stage, which, in use, drives an integrated RC load, and wherein a transconductance of the first gain stage varies inversely with a resistive value R of the RC load, and the compensation capacitor has a predetermined relationship with a value of a capacitance C of the integrated RC load.

* * * * *